United States Patent
Tran et al.

(10) Patent No.: US 10,340,010 B2
(45) Date of Patent: Jul. 2, 2019

(54) METHOD AND APPARATUS FOR CONFIGURING ARRAY COLUMNS AND ROWS FOR ACCESSING FLASH MEMORY CELLS

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Vipin Tiwari, Dublin, CA (US); Nhan Do, Saratoga, CA (US)

(73) Assignee: SILICON STORAGE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 15/238,681

(22) Filed: Aug. 16, 2016

(65) Prior Publication Data

US 2018/0053553 A1    Feb. 22, 2018

(51) Int. Cl.
| | |
|---|---|
| *G11C 16/10* | (2006.01) |
| *G11C 16/08* | (2006.01) |
| *G11C 16/14* | (2006.01) |
| *G11C 16/24* | (2006.01) |
| *G11C 16/34* | (2006.01) |
| *G11C 16/26* | (2006.01) |
| *G11C 16/04* | (2006.01) |
| *G11C 16/28* | (2006.01) |
| *G11C 16/32* | (2006.01) |

(52) U.S. Cl.
CPC .......... *G11C 16/08* (2013.01); *G11C 16/0425* (2013.01); *G11C 16/10* (2013.01); *G11C 16/14* (2013.01); *G11C 16/24* (2013.01); *G11C 16/26* (2013.01); *G11C 16/28* (2013.01); *G11C 16/32* (2013.01); *G11C 16/3418* (2013.01); *G11C 16/3427* (2013.01); *G11C 2216/04* (2013.01); *G11C 2216/22* (2013.01)

(58) Field of Classification Search
CPC .......... G11C 16/08; G11C 16/14; G11C 16/24
USPC ..................................... 365/185.02
See application file for complete search history.

(56) References Cited

U.S. PATENT DOCUMENTS

| | | | |
|---|---|---|---|
| 5,313,420 A | 5/1994 | Masuoka | |
| 5,912,843 A * | 6/1999 | Jeng ................... | G11C 16/0425 257/316 |
| 6,181,607 B1 * | 1/2001 | Lee ..................... | G11C 16/0425 365/185.05 |
| 6,301,152 B1 | 10/2001 | Campardo | |
| 6,449,190 B1 | 9/2002 | Bill | |
| 6,687,162 B1 | 2/2004 | Hsueh | |
| 6,772,273 B1 | 8/2004 | Tedrow et al. | |
| 8,853,027 B2 | 10/2014 | Hong | |
| 2002/0101778 A1 | 8/2002 | Khan | |

(Continued)

*Primary Examiner* — Xiaochun L Chen
(74) *Attorney, Agent, or Firm* — DLA Piper LLP US

(57) ABSTRACT

In one embodiment of the present invention, one row is selected and two columns are selected for a read or programming operation, such that twice as many flash memory cells can be read from or programmed in a single operation compared to the prior art. In another embodiment of the present invention, two rows in different sectors are selected and one column is selected for a read operation, such that twice as many flash memory cells can be read in a single operation compared to the prior art.

4 Claims, 19 Drawing Sheets

(56) References Cited

U.S. PATENT DOCUMENTS

| | | | |
|---|---|---|---|
| 2002/0163838 A1* | 11/2002 | Guterman | G11C 11/5621 |
| | | | 365/185.28 |
| 2003/0206456 A1* | 11/2003 | Hsu | G11C 7/18 |
| | | | 365/200 |
| 2007/0086255 A1 | 4/2007 | Lin | |
| 2014/0104956 A1 | 4/2014 | Pabustan | |
| 2015/0117109 A1* | 4/2015 | La Rosa | G11C 16/0425 |
| | | | 365/185.18 |
| 2015/0131383 A1 | 5/2015 | Akerib | |
| 2016/0042790 A1* | 2/2016 | Tran | G11C 16/16 |
| | | | 365/185.29 |

* cited by examiner

METHOD AND APPARATUS FOR CONFIGURING ARRAY COLUMNS AND ROWS FOR ACCESSING FLASH MEMORY CELLS

TECHNICAL FIELD

The present invention relates to an improved system and method for configuring flash memory cells in a flash memory array for reading and programming operations. In one embodiment, circuitry allows adjacent columns in the array to be simultaneously accessed for read or programming operations. In another embodiment, circuitry allows two rows, located in different sectors, to be simultaneously accessed for read or programming operations. This enables faster read and write operations.

BACKGROUND OF THE INVENTION

Non-volatile memory cells are well known in the art. One prior art non-volatile split gate memory cell 10, which contains five terminals, is shown in FIG. 1. Memory cell 10 comprises semiconductor substrate 12 of a first conductivity type, such as P type. Substrate 12 has a surface on which there is formed a first region 14 (also known as the source line SL) of a second conductivity type, such as N type. A second region 16 (also known as the drain line) also of N type is formed on the surface of substrate 12. Between the first region 14 and the second region 16 is channel region 18. Bit line BL 20 is connected to the second region 16. Word line WL 22 is positioned above a first portion of the channel region 18 and is insulated therefrom. Word line 22 has little or no overlap with the second region 16. Floating gate FG 24 is over another portion of channel region 18. Floating gate 24 is insulated therefrom, and is adjacent to word line 22. Floating gate 24 is also adjacent to the first region 14. Floating gate 24 may overlap the first region 14 to provide coupling from the first region 14 into floating gate 24. Coupling gate CG (also known as control gate) 26 is over floating gate 24 and is insulated therefrom. Erase gate EG 28 is over the first region 14 and is adjacent to floating gate 24 and coupling gate 26 and is insulated therefrom. The top corner of floating gate 24 may point toward the inside corner of the T-shaped erase gate 28 to enhance erase efficiency. Erase gate 28 is also insulated from the first region 14. Memory cell 10 is more particularly described in U.S. Pat. No. 7,868,375, whose disclosure is incorporated herein by reference in its entirety.

One exemplary operation for erase and program of prior art non-volatile memory cell 10 is as follows. Memory cell 10 is erased, through a Fowler-Nordheim tunneling mechanism, by applying a high voltage on erase gate 28 with other terminals equal to zero volts. Electrons tunnel from floating gate 24 into erase gate 28 causing floating gate 24 to be positively charged, turning on the cell 10 in a read condition. The resulting cell erased state is known as '1' state.

Memory cell 10 is programmed, through a source side hot electron programming mechanism, by applying a high voltage on coupling gate 26, a high voltage on source line 14, a medium voltage on erase gate 28, and a programming current on bit line 20. A portion of electrons flowing across the gap between word line 22 and floating gate 24 acquire enough energy to inject into floating gate 24 causing the floating gate 24 to be negatively charged, turning off the cell 10 in a read condition. The resulting cell programmed state is known as '0' state.

Memory cell 10 is read in a Current Sensing Mode as following: A bias voltage is applied on bit line 20, a bias voltage is applied on word line 22, a bias voltage is applied on coupling gate 26, a bias or zero voltage is applied on erase gate 28, and a ground is applied on source line 14. There exists a cell current flowing from bit line 20 to source line 14 for an erased state and there is insignificant or zero cell current flow from the bit line 20 to the source line 14 for a programmed state. Alternatively, memory cell 10 can be read in a Reverse Current Sensing Mode, in which bit line 20 is grounded and a bias voltage is applied on source line 24. In this mode the current reverses the direction from source line 14 to bitline 20.

Memory cell 10 alternatively can be read in a Voltage Sensing Mode as following: A bias current (to ground) is applied on bit line 20, a bias voltage is applied on word line 22, a bias voltage is applied on coupling gate 26, a bias voltage is applied on erase gate 28, and a bias voltage is applied on source line 14. There exists a cell output voltage (significantly>0V) on bit line 20 for an erased state and there is insignificant or close to zero output voltage on bit line 20 for a programmed state. Alternatively, memory cell 10 can be read in a Reverse Voltage Sensing Mode, in which bit line 20 is biased at a bias voltage and a bias current (to ground) is applied on source line 14. In this mode, memory cell 10 output voltage is on the source line 14 instead of on the bit line 20.

In the prior art, various combinations of positive or zero voltages were applied to word line 22, coupling gate 26, and floating gate 24 to perform read, program, and erase operations In response to the read, erase or program command, the logic circuit 245 (in FIG. 2) causes the various voltages to be supplied in a timely and least disturb manner to the various portions of both the selected memory cell 10 and the unselected memory cells 10.

For the selected and unselected memory cell 10, the voltage and current applied are as follows. As used hereinafter, the following abbreviations are used: source line or first region 14 (SL), bit line 20 (BL), word line 22 (WL), and coupling gate 26 (CG).

TABLE NO. 1

| | | | | | | PEO (Positive Erase Operation) Table | | | | |
|---|---|---|---|---|---|---|---|---|---|---|
| | | WL | WL-unsel | BL | BL-unsel | CG | CG-unsel same sector | CG-unsel | EG | EG-unsel |
| | Read | 1.0-2 V | 0 V | 0.6-2 V | 0 V/FLT | 0-2.6 V | 0-2.6 V | 0-2.6 V | 0-2.6 V | 0-2.6 V |
| | Erase | 0 V | 0 V | 0 V | 0 V | 0 V | 0-2.6 V | 0-2.6 V | 11.5-12 V | 0-2.6 V |
| | Program | 1 V | 0 V | 1uA | Vinh | 10-11 V | 0-2.6 V | 0-2.6 V | 4.5-5 V | 0-2.6 V |

TABLE NO. 1-continued

| PEO (Positive Erase Operation) Table | | |
|---|---|---|
| | SL | SL-unsel |
| Read | 0 V | 0 V/Bias/FLT |
| Erase | 0 V | 0 V |
| Program | 4.5-5 V | 0-1 V/FLT |

In a recent application by the applicant—U.S. patent application Ser. No. 14/602,262, filed on Jan. 21, 2015, which is incorporated by reference—the applicant disclosed an invention whereby negative voltages could be applied to word line 22 and/or coupling gate 26 during read, program, and/or erase operations. In this embodiment, the voltage and current applied to the selected and unselected memory cell 10, are as follows.

TABLE NO. 2

| PEO (Positive Erase Operation) Table | | | | | | | | | |
|---|---|---|---|---|---|---|---|---|---|
| | WL | WL-unsel | BL | BL-unsel | CG | CG-unsel same sector | CG-unsel | EG | EG-unsel |
| Read | 1.0-2 V | −0.5 V/0 V | 0.6-2 V | 0 V/FLT | 0-2.6 V | 0-2.6 V | 0-2.6 V | 0-2.6 V | 0-2.6 V |
| Erase | 0 V | 0 V | 0 V | 0 V | 0 V | 0-2.6 V | 0-2.6 V | 11.5-12 V | 0-2.6 V |
| Program | 1 V | −0.5 V/0 V | 1uA | Vinh | 10-11 V | 0-2.6 V | 0-2.6 V | 4.5-5 V | 0-2.6 V |

| | SL | SL-unsel |
|---|---|---|
| Read | 0 V | 0 V/Bias/FLT |
| Erase | 0 V | 0 V |
| Program | 4.5-5 V | 0-1 V/FLT |

In another embodiment of U.S. patent application Ser. No. 14/602,262, negative voltages can be applied to word line 22 when memory cell 10 is unselected during read, erase, and program operations, and negative voltages can be applied to coupling gate 26 during an erase operation, such that the following voltages are applied:

TABLE NO. 3

| PNEO (Positive Negative Erase Operation) Table | | | | | | | | | |
|---|---|---|---|---|---|---|---|---|---|
| | WL | WL-unsel | BL | BL-unsel | CG | CG-unsel same sector | CG-unsel | EG | EG-unsel |
| Read | 1.0-2 V | −0.5 V/0 V | 0.6-2 V | 0 V | 0-2.6 V | 0-2.6 V | 0-2.6 V | 0-2.6 V | 0-2.6 V |
| Erase | 0 V | −0.5 V/0 V | 0 V | 0 V | −(5-9) V | 0-2.6 V | 0-2.6 V | 8-9 V | 0-2.6 V |
| Program | 1 V | −0.5 V/0 V | 1uA | Vinh | 8-9 V | CGINH (4-6 V) | 0-2.6 V | 8-9 V | 0-2.6 V |

| | SL | SL-unsel |
|---|---|---|
| Read | 0 V | 0 V/Bias/FLT |
| Erase | 0 V | 0 V |
| Program | 4.5-5 V | 0-1 V/FLT |

In the above table, "FLT" refers to a floating node.

The CGINH signal listed above is an inhibit signal that is applied to the coupling gate 26 of an unselected cell that shares an erase gate 28 with a selected cell.

In the prior art systems described above, during a read or programming operation, a single row and a single column would be activated, such that the flash memory cells located at the selected row and selected column could be read from or programmed.

With flash memory systems becoming ubiquitous in all manner of computing and electronic devices, it is increasingly important to create designs that enable faster read and programming operations. What is needed is flash memory system that allows a greater number of flash memory cells to be accessed for read and programming operations compared to the prior art systems.

SUMMARY OF THE INVENTION

The present invention solves this need through two exemplary embodiments. In one embodiment, one row is selected and two columns are selected for a read or programming operation, such that twice as many flash memory cells can be read from or programmed in a single operation compared to the prior art. In another embodiment, two rows in different sectors are selected and one column is selected for a read operation, such that twice as many flash memory cells can be read in a single operation compared to the prior art.

DETAILED DESCRIPTION OF THE PREFERRED EMBODIMENT

Figure 1:
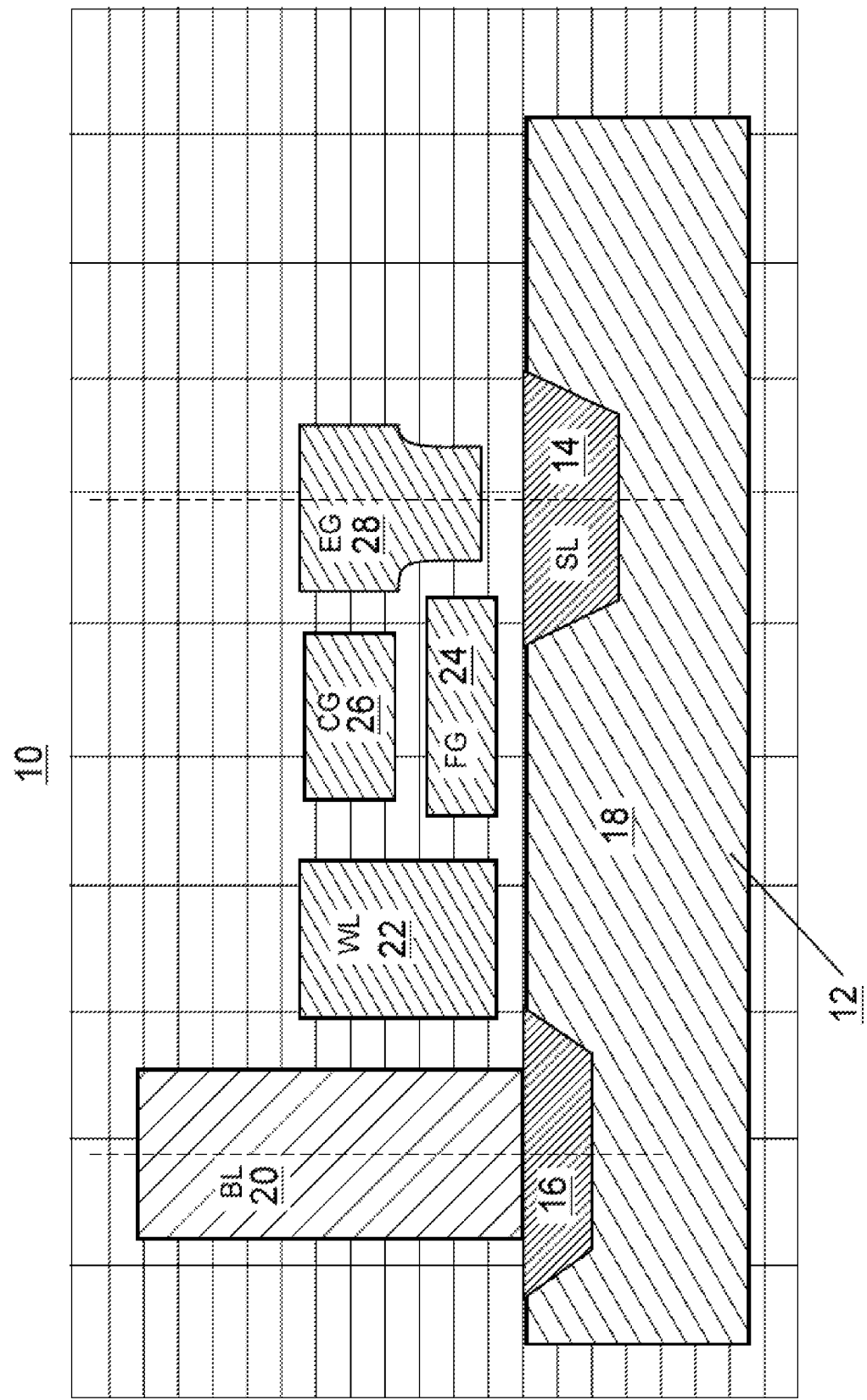
FIG. 1 is a cross-sectional view of a non-volatile memory cell of the prior art to which the method of the present invention can be applied.
Figure 2:
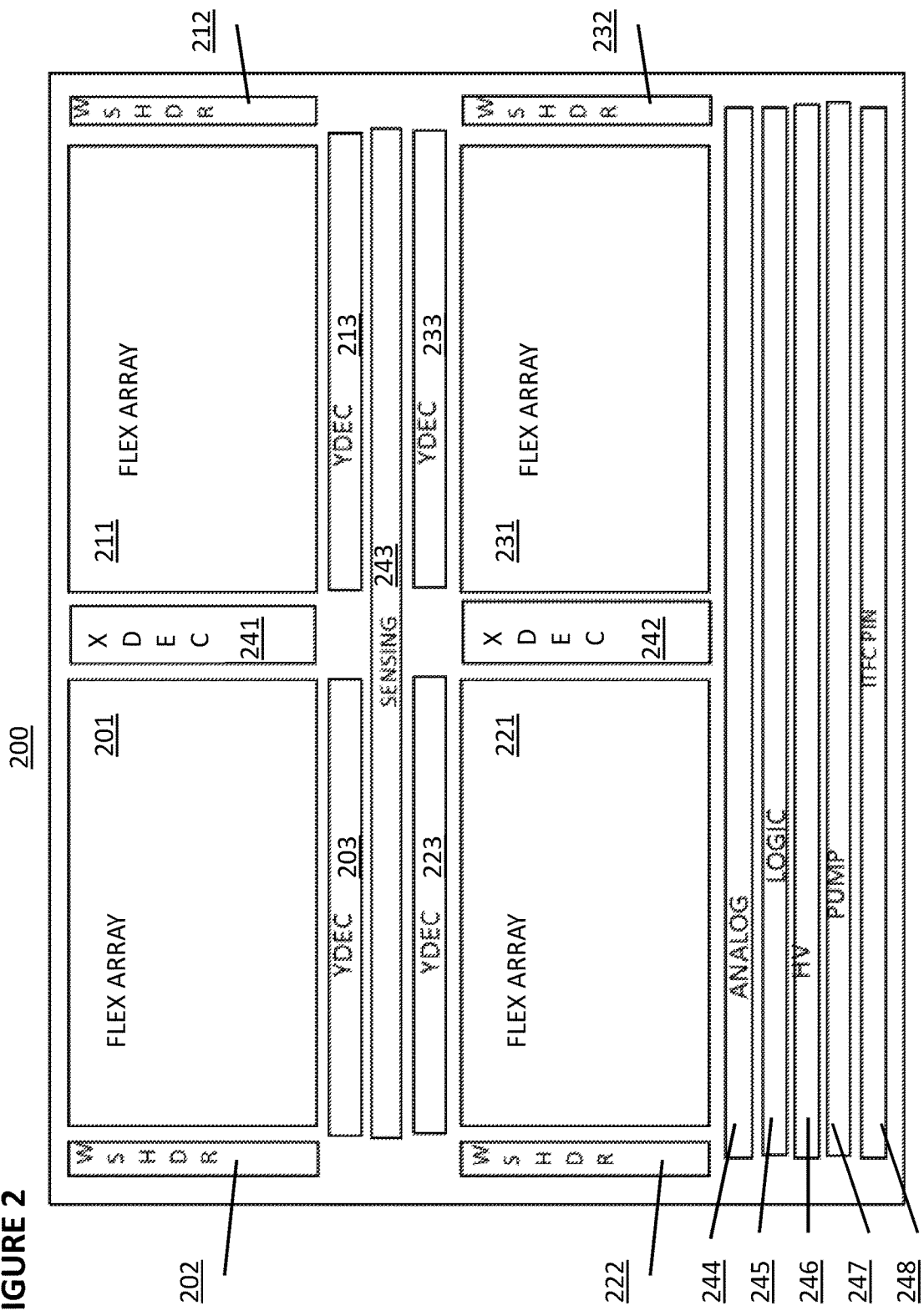
FIG. 2 is a block diagram of a non-volatile memory device using the non-volatile memory cell of FIG. 1.

An embodiment of the inventive flash memory system is depicted in FIG. 2. Die 200 comprises flexible memory arrays 201, 211, 221, and 231, for storing data, each of flexible memory arrays 201, 211, 221, and 231 comprising rows and columns of memory cells of the type described previously as flash memory cell 100 in FIG. 1. Die 200 further comprises sensing circuit 243 used to read data from memory arrays 201, 211, 221, and 231; row decoder circuit 241 used to access the selected row or rows in memory arrays 201 and 211 and row decoder circuit 242 used to access the selected row or rows in memory arrays 221 and to be read from or written to; column decoder circuits 203, 213, 223, and 233 used to access one or two bytes in memory arrays 201, 211, 221, and 231, respectively, to be read from or written to; high voltage row decoder WSHDR 202, 212, 222, and 232 used to provide high voltage to one or more terminals of the selected memory cell within memory arrays 201, 211, 221, and 231, respectively, depending on the operation being performed.

Die 200 further comprises the following functional structures and sub-systems: macro interface pins ITFC pin 248 for interconnecting to other macros on a SOC (system on chip); low voltage generation (including a low voltage charge pump circuit) circuits 247 and high voltage generation (including a high voltage charge pump circuit) circuit 246 used to provide increased voltages for program and erase operations for flexible memory arrays 201, 211, 221, and 231; analog circuit 244 used by analog circuitry on die 200; digital logic circuit 245 used by digital circuitry on die 200.

Figure 3:
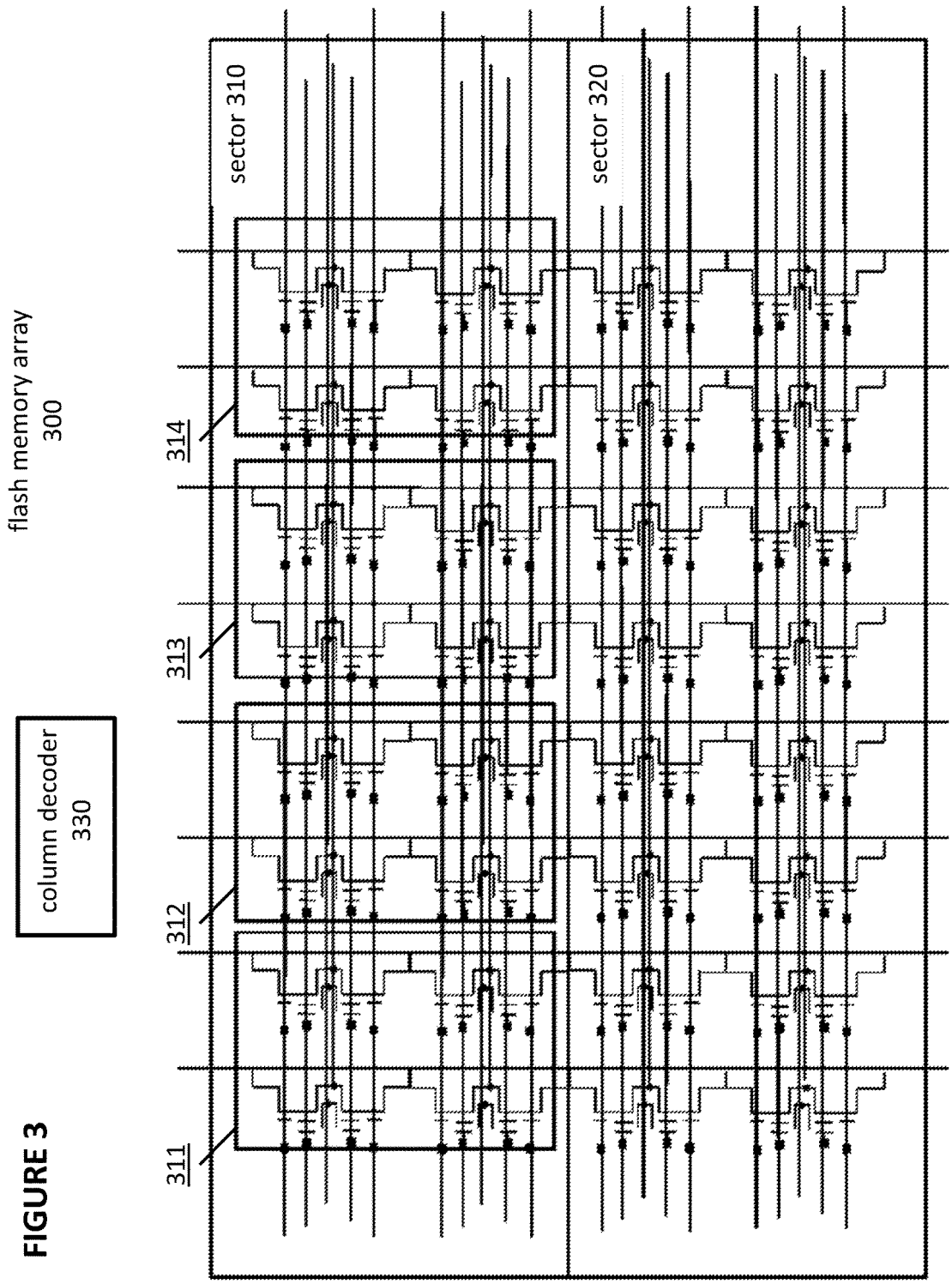
FIG. 3 depicts an embodiment for accessing two columns within a flash memory array.

FIG. 3 depicts an embodiment of that enables the reading and programming of two columns at once. Flash memory array 300 (which is an example of flexible memory arrays 201, 211, 221, and 231) may comprise a plurality of exemplary sectors 310 and 320. Each sector is organized such that the programming disturb (unselected memory cells subject to high voltage condition) is self-contained within it, meaning the disturb of one sector does not impact the disturb of other sectors. It is to be understood that flash memory array 300 will comprise many more sectors than the ones shown. Adjacent columns are grouped into pairs, such as column pairs 311, 312, 313, and 314. Column decoder 330 will select pairs of columns, such as one of pairs 311, 312, 313, and 314, during a read or programming, such that when a row is also selected, two flash memory cells can be accessed instead of just one as in the prior art. The two selected memory cells couple to a sense amplifier to output a logic '1' ('1'=erased state) or '0' ('0'=programmed state). Optionally, each sector can be configured to operate in a dual-column mode or in the traditional single-column mode. A method of programming the two adjacent columns of FIG. 3 is as follows. In one embodiment, both columns are programmed at the same time. In this case, the high voltage supply is required to provide double the programming current compared to the situation where one column is programmed. In another embodiment, the programming of the adjacent columns is timed multiplexed, meaning that one column is programmed at a time. In this case, the high voltage supply is only required to provide a single programming current at the expense of doubling the program time.

Figure 4B:
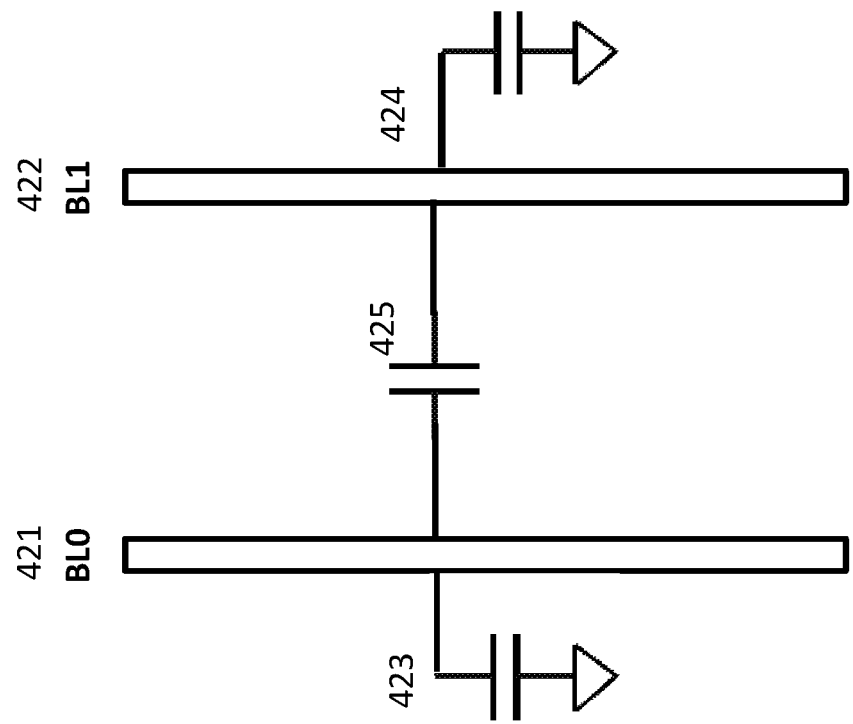
FIG. 4B depicts the relationship between adjacent columns in FIG. 3.
Figure 4A:
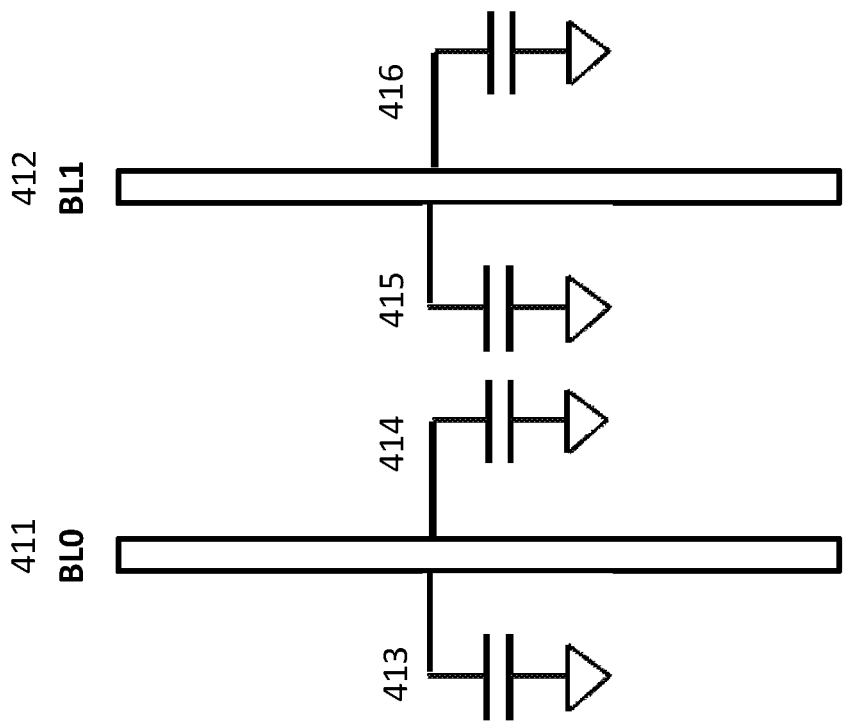
FIG. 4A depicts the relationship between adjacent columns in a prior art flash memory array.

In addition to the speed improvement that accessing two columns instead of one column will provide, another advantage of the embodiment of FIG. 3 is shown in FIGS. 4A and 4B. FIG. 4A depicts the conventional art and shows isolated bit lines 411 (BL0) and 412 (BL1). Bitline 411 has an inherent capacitance that is modeled with capacitor 413 and capacitor 414, and bitline 412 has an inherent capacitance that is modeled with capacitor 415 and capacitor 416. By asserting both bitlines 411 and 412 at the same times there are four capacitors 413, 414, 415, 416 in effect. The effect of capacitors 413, 414, 415, and 416 is that when one of bitlines 411 and 412 is asserted, the voltage ramp-up time and ramp-down times will be longer than would be the case if the capacitors did not exist. Notably, the voltage ramp-up and ramp-down times may be different for bitlines 411 and 412.

By contrast, FIG. 4B depicts the embodiment of FIG. 3 and shows adjacent bit lines 421 (BL0) and 422 (BL1). Bitline 421 has an inherent capacitance that is modeled with capacitor 423, and bitline 422 has an inherent capacitance that is modeled with capacitor 424. In addition, a parasitic capacitance exists between bitlines 421 and 212 and is modeled as capacitor 425. Effectively, there is no parasitic capacitance existing between bitlines 421 and 422 because bitlines 421 and 422 are asserted at the same time, meaning the voltage on those bitlines always ramp up or down at the same rate. The capacitance of capacitors 423, 424, and 425 is much smaller than the capacitance of capacitors 413, 414, 415, and 416.

Figure 5:
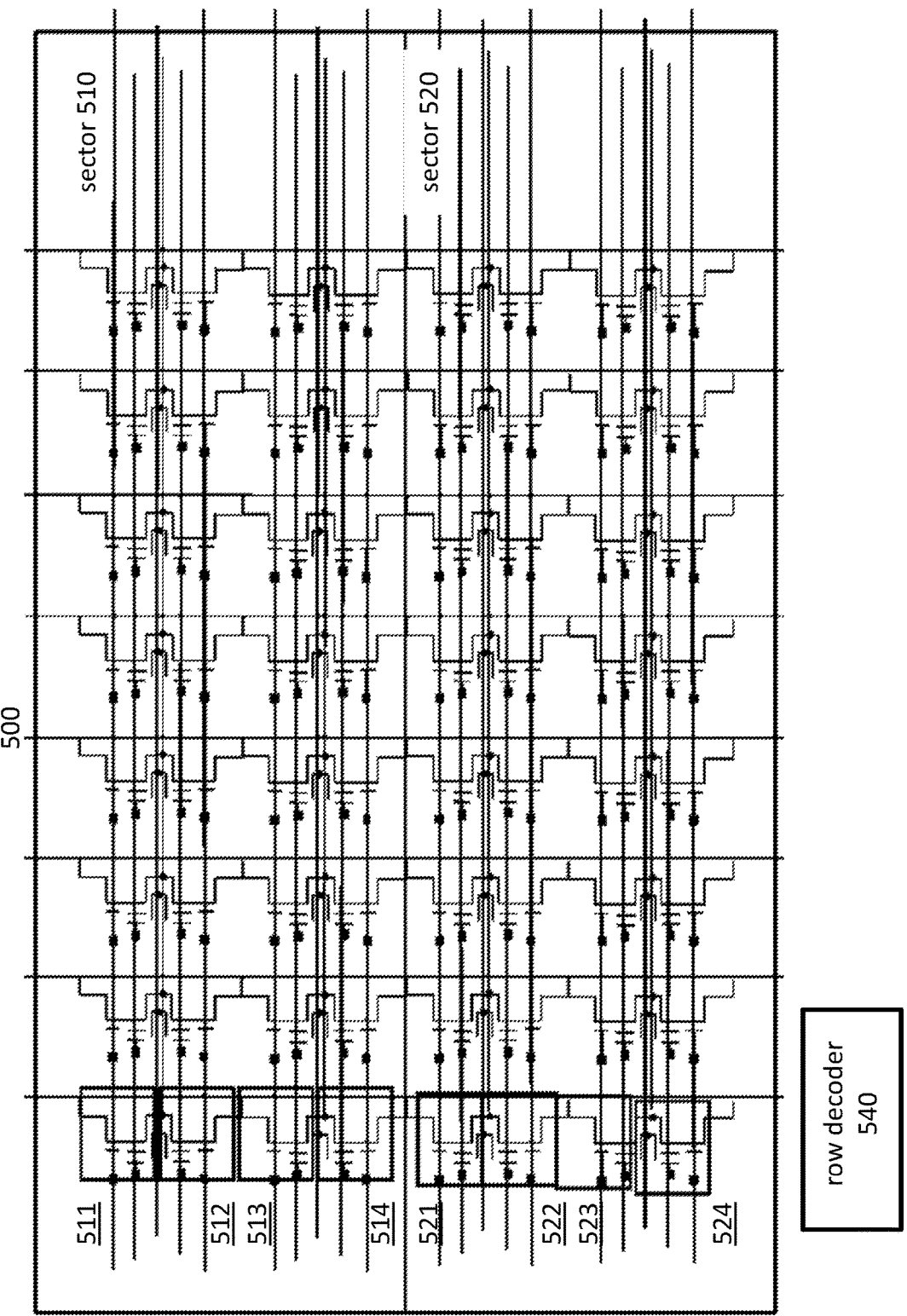
FIG. 5 depicts an embodiment for accessing two rows in different sectors within a flash memory array.

FIG. 5 depicts an embodiment that allows the reading or programming of two isolated rows at a time. Flash memory array 500 comprises sector 510 and sector 520. The flash memory array 500 may comprise a plurality of exemplary sectors 510 and 520. Sector 510 comprises rows 511, 512, 513, and 514 of flash memory cells, and sector 520 comprises rows 521, 522, 523, and 524 of flash memory cells. It is to be understood that flash memory array 500 will comprise many more sectors than the ones shown. Two rows from different sectors (isolated rows) are grouped into pairs. This is to minimize sector programming disturb. For example, rows 511 and 521 can from a pair, rows 512 and 522 can form a pair, rows 513 and 523 can form a pair, and rows 514 and 524 can form a pair. Row decoder 540 will select a pair of rows during a read or program operation, such that when a columns is also selected, two flash memory cells can be read or programmed instead of just one as in the prior art. The two selected memory cells couple to a sense amplifier to output a logic '1' ('1'=erased state) or '0' ('0'=programmed state). Optionally, each sector can be configured to operate in a dual-row mode or in the traditional single-row mode A method of programming the two isolated rows in FIG. 5 is as follows. In one embodiment, both selected rows are programmed at the same time. In this case, the high voltage supply is required to provide double the programming current compared to the situation where only one row is programmed. In another embodiment, programming is time multiplexed, meaning one row is programmed at a time. In this case, the high voltage supply is only required to provide a single programming current at the expense of doubling the program time.

Figure 6:
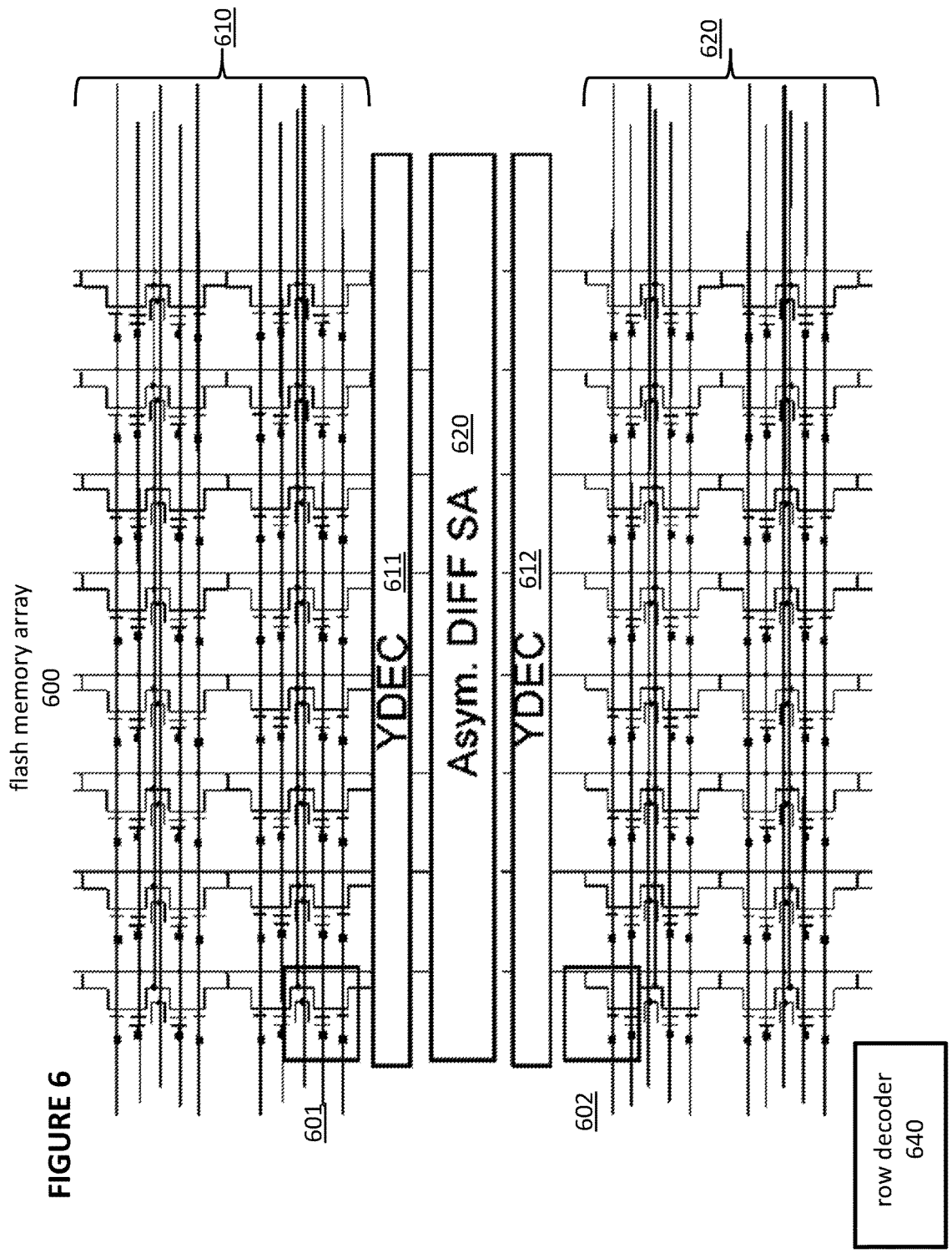
FIG. 6 depicts an embodiment for accessing two rows in different sectors within a flash memory array and sensing the difference between the selected cells in different sectors.

FIG. 6 depicts an embodiment that allows the reading or programming of two isolated rows at a time using differential sense amplifier 620. Flash memory array 600 comprises sector 610 and 620, each comprising rows of flash memory cells. It is to be understood that flash memory array 600 will comprise many more sectors than the ones shown. Isolated rows are grouped into differential pairs. For example, row 601 in sector 610 and row 602 in sector 620 are grouped together as a pair. During a read or program operation, row decoder 640 will select pairs of rows, such as the pair comprising rows 601 and 602. In this example, during a read or program operation, column decoder 611 will select a flash memory cell in row 601 for reading, and column decoder 612 will select a flash memory cell in row 602 for reading or programming.

The selected cell in each row will be coupled to differential sense amplifier 620, which will read the values of the cell pair. In one embodiment, a "1" will be stored by erasing both cells in a cell pair, and a "0" will be stored by programming one cell and erasing one cell in a cell pair. In another embodiment, a "1" will be stored by programming one cell and erasing one cell in a cell pair, and a "0" will be stored by programming both cells in a cell pair. Thus, each cell pair stores only one data value, which is stored as a difference in the pair. This can save power at the expense of greater erase time and programming time to store a single value.

A method of programming the two isolated rows in FIG. 6 is as follows. In one embodiment, both selected rows in the different sectors are programmed at the same time. In this case, the high voltage supply is required to provide double the programming current compared to the situation where only one row is programmed. In another embodiment, programming is time multiplexed, meaning one row is programmed at a time. In this case, the high voltage supply is only required to provide a single programming current at the expense of doubling the program time.

The above-described embodiments enable methods of utilizing two columns or two rows can be enabled by system configuration bits configured upon power up of the flash memory system or by issuing a command by specific applications. The methods of utilizing two columns or two rows are done for the purpose, for example, of higher access speed performance or higher endurance cycle performance.

Methods of utilizing more than two columns or more than two rows at a time are possible for the above-described embodiments.

Figure 7:
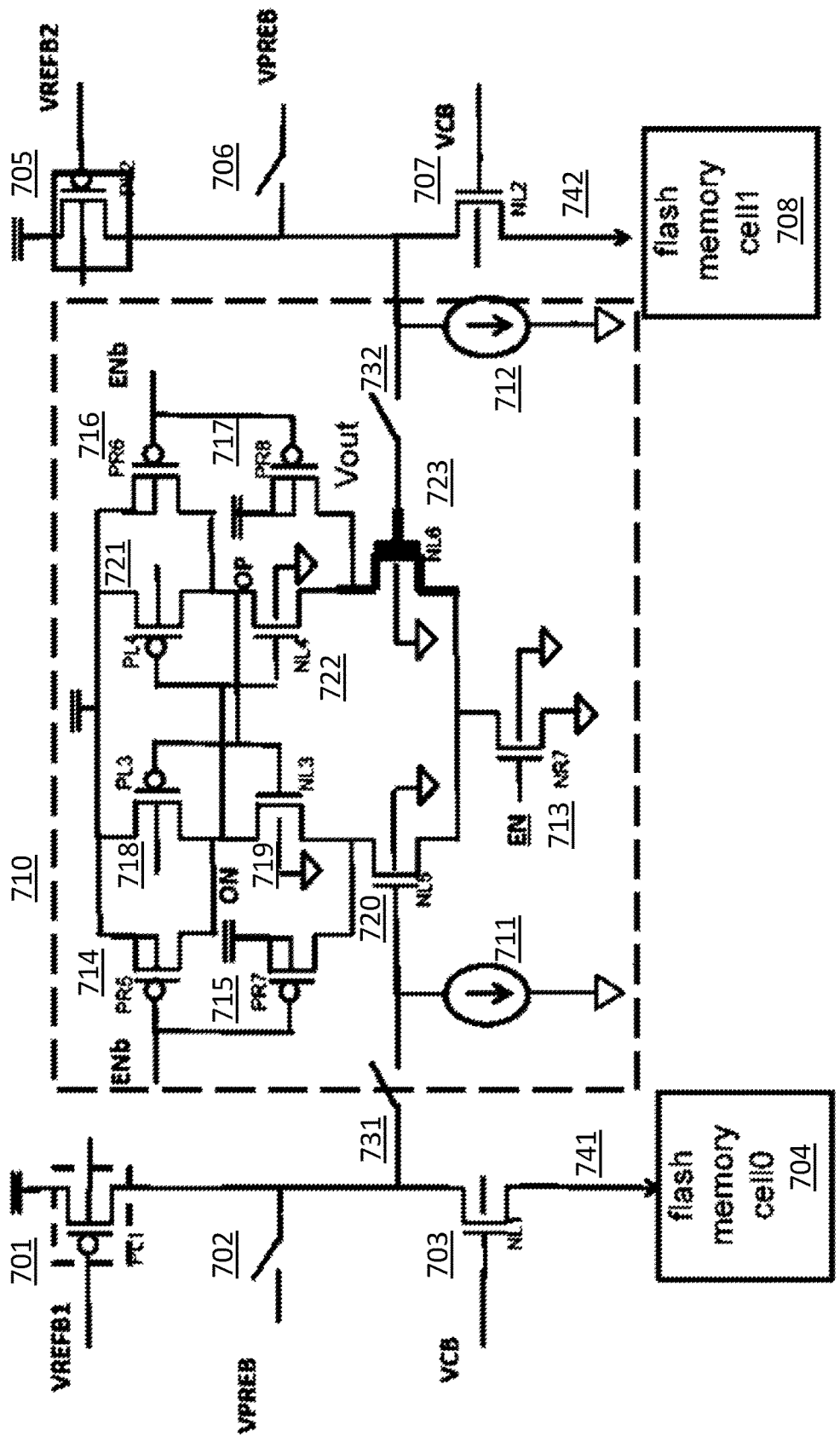
FIG. 7 depicts an embodiment of a differential sense amplifier.

FIG. 7 depicts a preferred differential sensing amplifier 700, which is an exemplary embodiment that can be used for differential sensing amplifier 620. Differential sensing amplifier 700 is coupled to flash memory cell 704 and flash memory cell 708. Differential sensing amplifier 700 is preferred because it produces a predetermined '1' or '0' output when the inputs of the differential sensing amplifier are the same, meaning when the current of the flash memory cell 704 and the current of the flash memory cell 708 are the same.

Differential sensing amplifier 700 comprises comparator 710, selected bit line coupling signal (or bitline coupling node) 731, and selected bit line coupling signal (or bitline coupling node) 732. Comparator 710 includes a cross coupled inverter pairs PMOS/NMOS 721/722 and PMOS/NMOS 718/719 enabled by a NMOS differential input pair 723 and 720, respectively. Comparator 710 includes PMOS 716 and PMOS 714 to pre-charge the outputs of the inverter pairs 721/722 and 718/719 to Vdd respectively. The output of sensing amplifier 700 is Vout.

Sensing amplifier further comprises loading PMOS transistors 701 and 705 coupled to VDD, switches 702 and 706 coupled to a precharge bias voltage source, and isolation NMOS transistors 703 and 707 for selectively coupling to flash memory cell 704 and flash memory cell 708 in response to the signal VCB as shown. In an embodiment, transistor 701 mirrors a reference current into the node 731. In another embodiment, transistor 705 mirrors a reference current into the node 732. The reference currents are for example derived from a reference memory cell. In another embodiment, the loading transistors 701 and 705 are used as a differential input offset (such as having different size or different threshold voltages) coupling to the gates of input differential pair 720 and 723. This is used to create a preferred output when inputs to the differential sense amplifier 700 are the same.

Sensing amplifier 700 further comprises a differential input pair comprising NMOS transistors 720 and 723 and an enabling pulldown NMOS transistor 713. The transistors 703 and 707 couple the selected bitline 741 and selected bitline 742 to the bitline coupling nodes 731 and 732, which couple to the gates of the input differential pair 720 and 723.

In an embodiment current sources 711 and 712 are used as a differential input offset coupling to the gates of input differential pair 720 and 723. This is used to create a preferred output when inputs to the differential sense amplifier 700 are the same.

Comparator 710 includes PMOS transistors 715 and 717 to pre-charge the drains of the input pair 720 and 723, respectively, to Vdd. An offset in the reference voltage established on bit line coupling signal 732 by flash memory cell 708 can be generated through built-in characteristics of sensing amplifier 700, such as by trimming the W (width) and L (length) (i.e., physical dimension) characteristics of NMOS transistor 723, which will result in different transconductance (gm) and/or Vt values for NMOS transistor 723. This will effectively cause the reference voltage on the node 732 to be dynamically tuning to the dimension of the transistor 723. This results in an offset voltage on the node 732 versus the node 731 such as 10 mV-150 mV. In another embodiment, the built-in offset is generated in the sense amplifier is by using different types of transistor for the input differential pair NMOS transistor 723 versus the NMOS transistor 720. For example the one transistor type cane be native NMOS type (threshold voltage=~zero volt) and the other can be enhancement NMOS type. Another example is one the transistor type is low NMOS Vt type (threshold voltage=~zero volt) and the other transistor type is regular or high Vt enhancement NMOS type. Another example for different transistor types is using different oxide thickness for the input differential pair. Another embodiment to generate built-in offset in the sense amplifier is by utilizing a non-equal bias current in the input pair, such as adding a parallel current bias in one of the input pair, for example by connecting a current bias to a drain of one NMOS input transistor.

Figure 8:
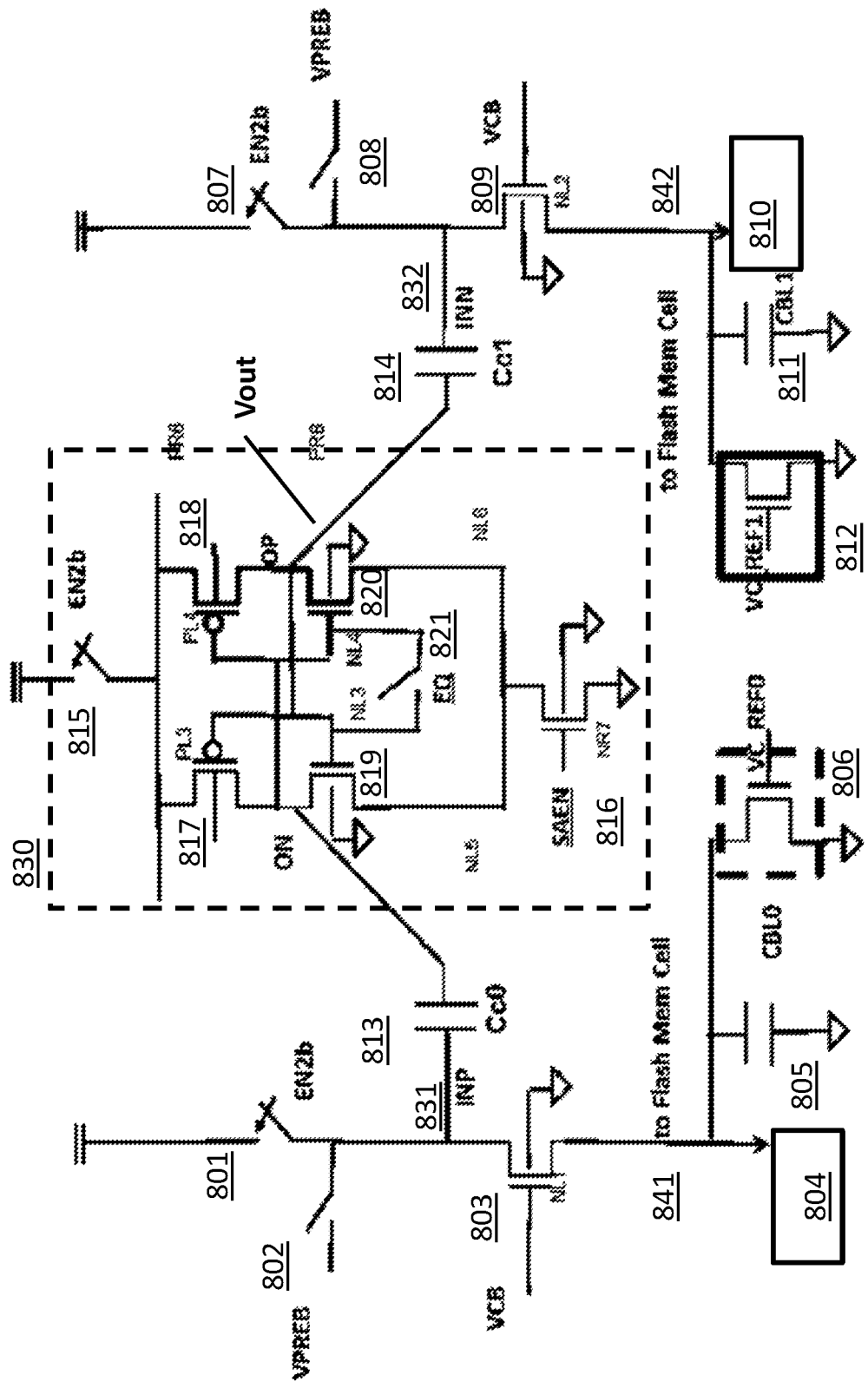
FIG. 8 depicts another embodiment of a differential sense amplifier.

FIG. 8 depicts another preferred differential sensing amplifier 800, which is another exemplary embodiment that can be used for differential sensing amplifier 620. FIG. 8 depicts another embodiment of differential sensing amplifier 620. Differential sensing amplifier 800 is coupled to flash memory cell 804 and flash memory cell 810. Differential sensing amplifier 800 comprises comparator 830, selected bit line coupling signal 831, and selected bit line coupling signal 832. The output of differential sensing amplifier 800 is Vout.

Comparator 830 includes cross coupled inverter pairs PMOS/NMOS transistors 817/819 and PMOS/NMOS transistors 818/820 enabled by NMOS transistor 816. In one embodiment, the dimension of the inverter PMOS/NMOS transistors 818/820 is sized such that to introduce a sensing offset versus inverter PMOS/NMOS transistors 817/819 to introduce a preferable comparison decision when voltages on nodes 831 and 832 are the same, meaning when the current of the flash memory cell 804 and the current of the flash memory cell 810 are the same Comparator 830 is powered through a switch 815. Differential sensing amplifier 800 further comprises switches 801, 802, 807, and 808; coupling capacitors 813 and 814; isolation NMOS transistors 803 and 809; ramping capacitors 805 and 811, and offset ramping NMOS transistors 806 and 812 (used to create offset at nodes 841 and 842 to introduce a preferable sensing comparison), configured as shown. Transistors 803 and 809 couple selected bitlines 841 and 842 to bitline coupling nodes 831 and 832, respectively. Nodes 831 and 832 couple to terminals of capacitors 813 and 814, respectively. The other terminals of coupling capacitor 814 and 813 couple to the outputs of the inverter pairs 818/820 and 817/819, respectively.

To save power, switches 801, 807, and 815 are disabled once the result of the comparison of the comparator 830 is decided.

During a sensing operation, NMOS transistors 806 and 812 will discharge the bias voltage stored in capacitors 805 and 811. NMOS transistors 806 and 812 are sized together with the size of the capacitor 805 and 811 to make a voltage slope ramping offset between bitline 842 and bitline 841. The voltage of bitline 842 linearly decreases between the ramping BL '0' (programmed cell) and BL '1' lines (erased cell). In one embodiment, the ramping offset is used introduce a preferable sensing comparison when the inputs to the differential amplifier 800 are the same.

In another embodiment, the size of the capacitor 814 is sized versus the capacitor 813 to introduce an offset at the node OP vs. node ON to introduce a preferable comparison when the current of the flash memory cell 804 and the current of the flash memory cell 810 are the same.

Figure 9:
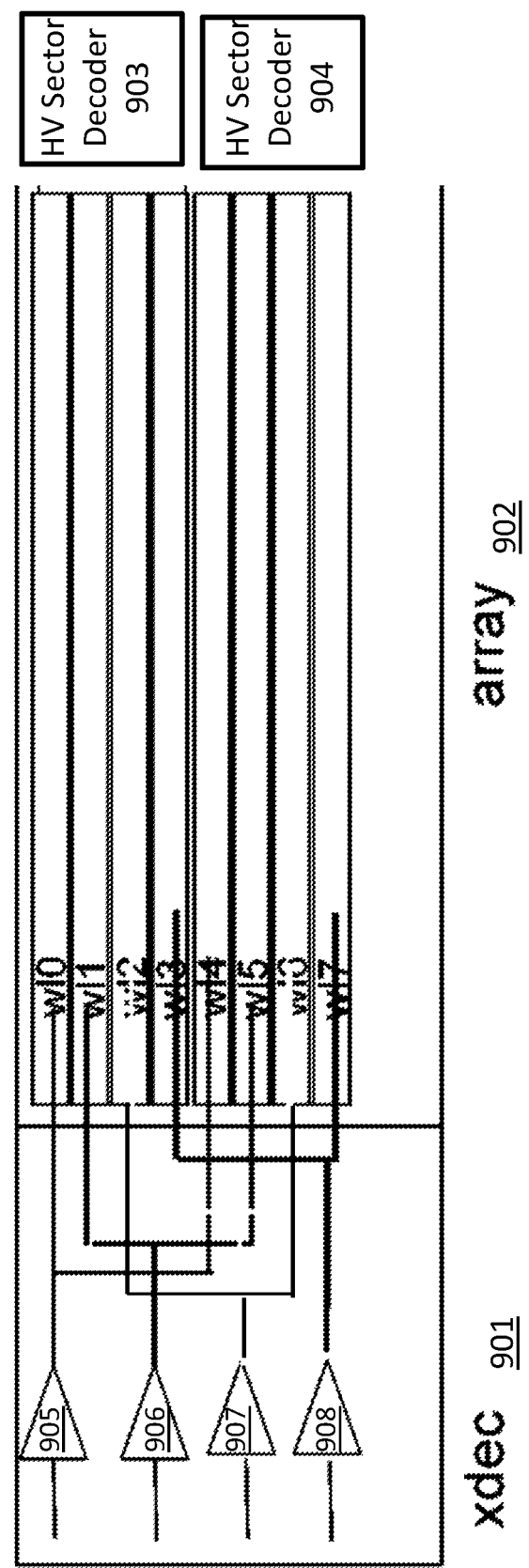
FIG. 9 depicts an embodiment for accessing two rows in different sectors within a flash memory array during a read operation and for accessing one row during a programming operation.

FIG. 9 depicts exemplary flash memory system 900. Flash memory system 900 comprises row decoder 901, which can be used as row decoders 540 and 640 in the embodiments described above. Flash memory system 900 further comprises array 902, high voltage sector decoder 903, and high voltage sector decoder 904. Row decoder 901 comprises a plurality of row drivers, here shown as row drivers 905, 906, 907, and 908. During a read operation, one of row drivers 905, 906, 907, and 908 will assert a pair of rows using the wordline associated with the row. High voltage sector decoder 903 or 904 will provide a high voltage to the driver to assert the terminal EG/CG/SL of the selected rows.

Figure 10:
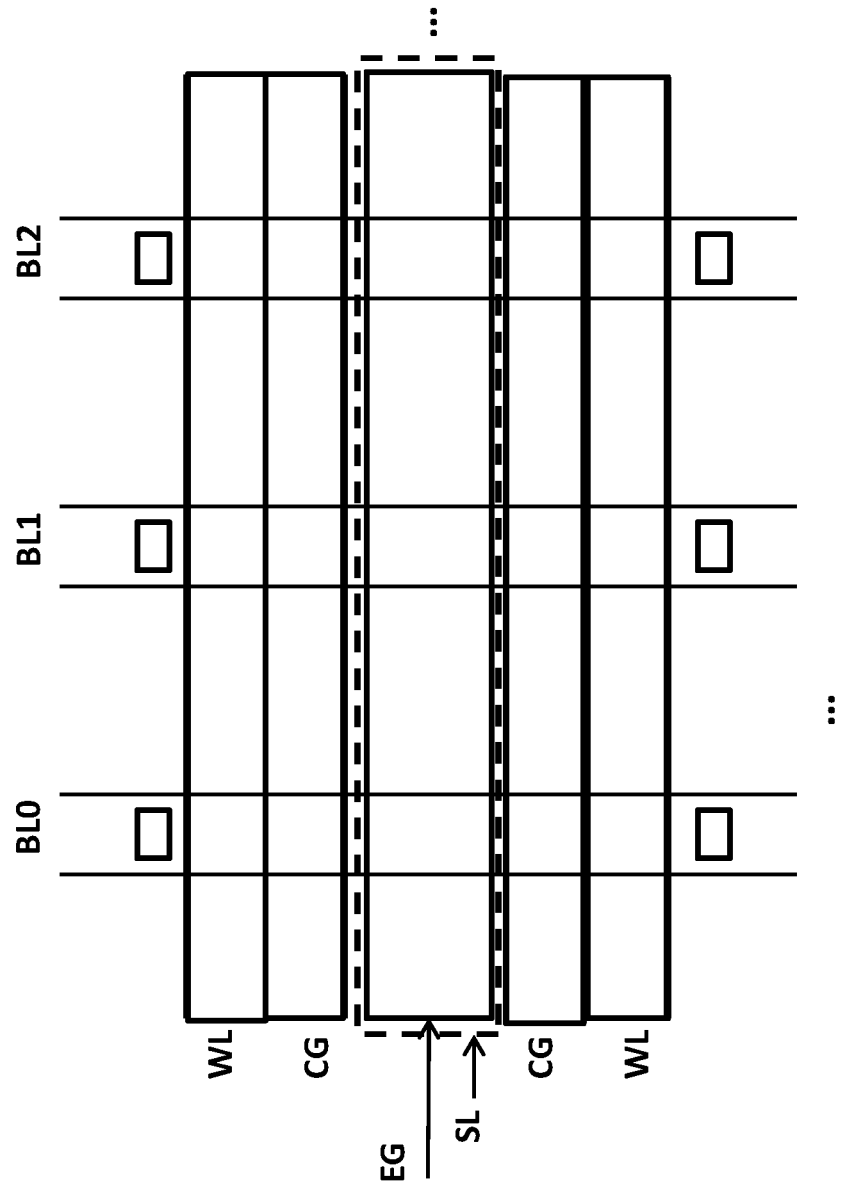
FIG. 10 depicts a mask layout for a flash memory array used in the embodiments.

FIG. 10 depicts an exemplary mask design for the embodiments described above. Mask 1000 comprises bit lines, word lines, and control gates as depicted. An embodiment can be made wherein a mask, e.g. diffusion mask, is changed to short two adjacent columns together.

Figure 11:
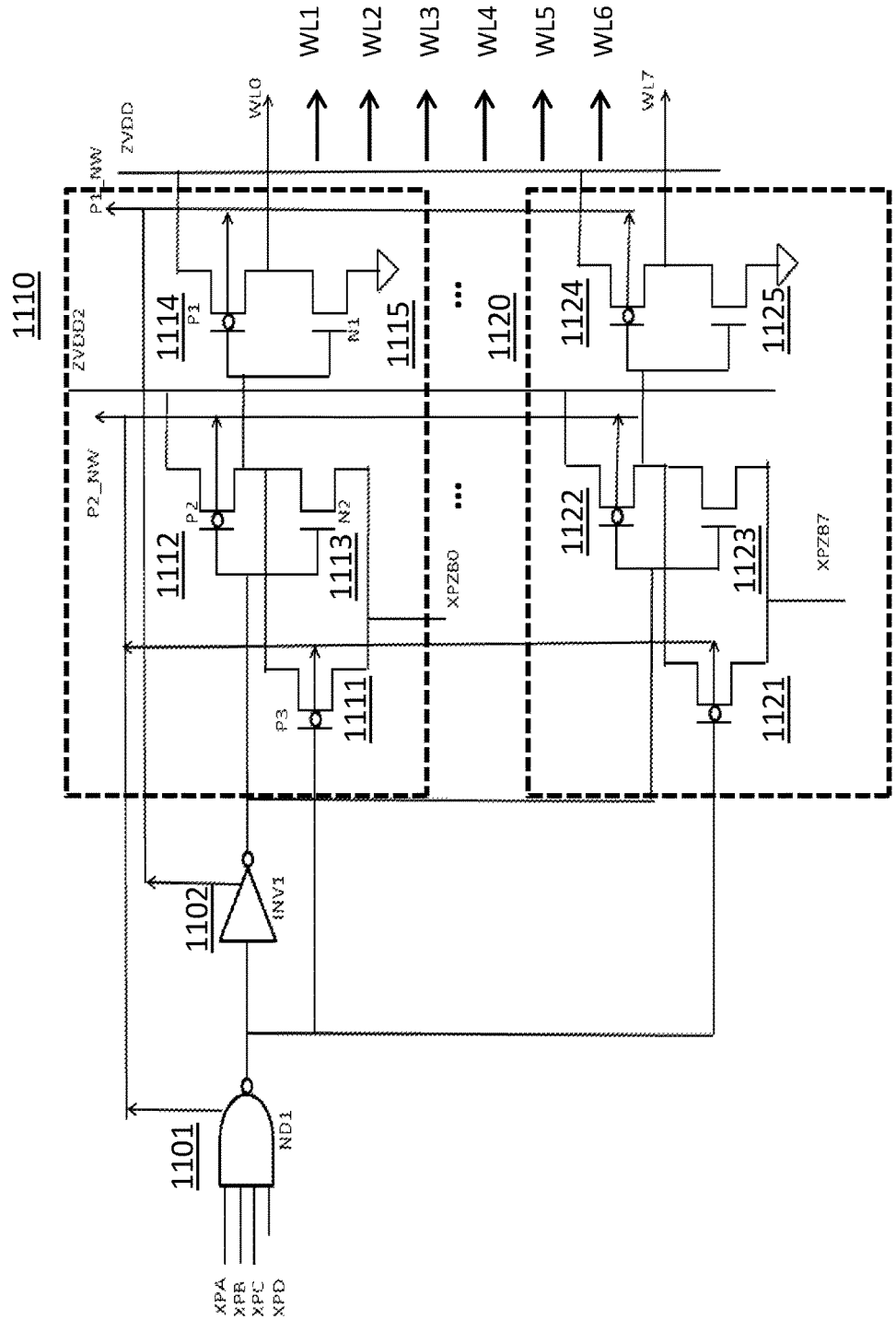
FIG. 11 depicts an embodiment of a row decoder for use with the memory device of FIG. 2.

FIG. 11 depicts row decoder 1100 for 8 word lines in a sector within a memory array (such as memory array 501, 511, 521, and 531). Row decoder 1100 can be used for row decoders 540 and 640 in the embodiments described above. Row decoder 1100 can be part of row decoder circuits 541 and 542 in die 500. Row decoder 1100 comprises NAND gate 1101, which receives pre-decoded address signals, here shown as lines XPA, XPB, XPC, and XPD, which select a sector within a memory array. When XPA, XPB XPC, and XPD are all "high," then the output of NAND gate 1101 will be "low" and this particular sector will be selected. line WL0, decoder circuit 1120 to generate WL7, as well as additional decoder circuits (not shown) to generate word lines WL1, WL2, WL3, WL4, WL5, and WL6.

Decoder circuit 1110 comprises PMOS transistors 1111, 1112, and 1114 and NMOS transistors 1113 and 1115, configured as shown. Decoder circuit 1110 receives the output of NAND gate 1101, the output of inverter 1102, and pre-decoded address signal XPZB0. When this particular sector is selected and XPZB0 is "low," then WL0 will be asserted. When XPZB0 is "high," then WL0 will not be asserted.

Similarly, decoder circuit 1120 comprises PMOS transistors 1121, 1122, and 1124 and NMOS transistors 1123 and 1125, configured as shown. Decoder circuit 1120 receives the output of NAND gate 1101, the output of inverter 1102, and pre-decoded address signal XPZB7. When this particular sector is selected and XPZB7 is "low," then WL7 will be asserted. When XPZB7 is "high," then WL7 will not be asserted.

It is to understood that the decoder circuits (now shown) for WL1, WL2, and WL3, WL4, WL5, and WL6 will follow the same design as decoder circuits 1110 and 1120 except that they will receive the inputs XPZB1, XPZB2, XPZB3, XPZB4, XPZB5, and XPZB6, respectively, instead of XPZB0 or XPZB7.

In the situation where this sector is selected and it is desired for WL0 to be asserted, the output of NAND gate 1101 will be "low," and the output of inverter will be "high." PMOS transistor 1111 will be turned on, and the node between PMOS transistor 1112 and NMOS transistor 1113 will receive the value of XPZB0, which will be "low" when word line WL0 is to be asserted. This will turn on PMOS transistor 1114, which will pull WL0 "high" to ZVDD which indicates an asserted state. In this instance, XPZB7 is "high," signifying that WL7 is to be not asserted, which will pull the node between PMOS transistor 1122 and NMOS transistor 1123 to the value of XPZB7 (which is "high"), which will turn on NMOS transistor 1124 and cause WL to be "low," which indicates a non-asserted state. In this manner, one of the word lines WL0 ... WL7 can be selected when this sector is selected.

Figure 12:
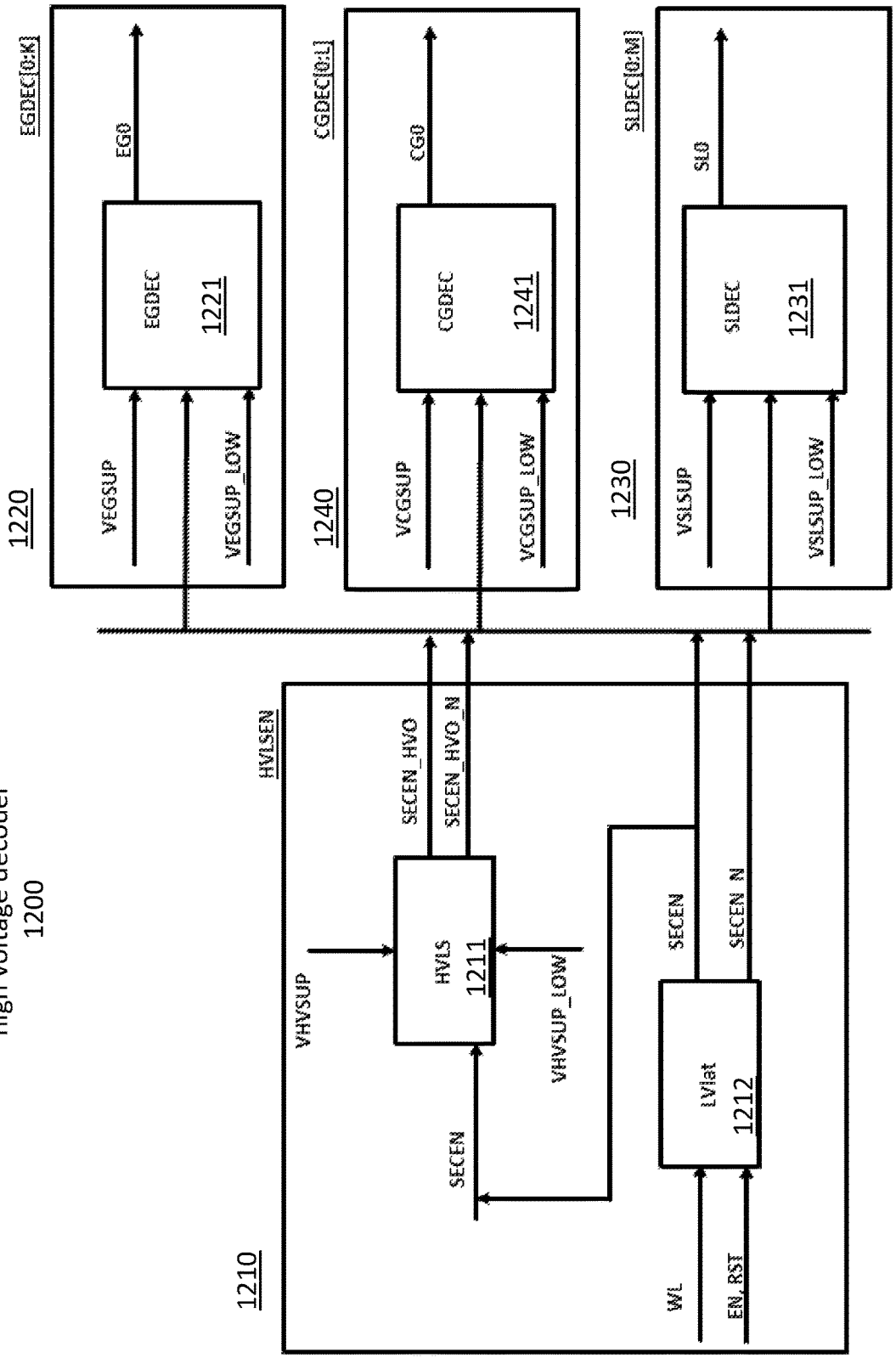
FIG. 12 is a block diagram of decoder circuitry for use with the memory device of FIG. 2.

FIG. 12 depicts high voltage decoder 1200. High voltage decoder 1200 can be used for high voltage sector decoders 903 and 904 shown in FIG. 9. High voltage decoder 1200 comprises high voltage level shift enable circuit 1210, erase gate decoder 1220, source line decoder 1230, and control gate decoder 1240.

High voltage level shift enable circuit 1210 comprises high voltage level shift circuit 1211 and low voltage latch 1212. Low voltage latch 1212 receives word line (WL), enable (EN), and reset (RST) as input signals and outputs sector enable signal (SECEN) and sector enable signal bar (SECEN_N). Sector enable signal (SECEN) is provided as an input to high voltage level shift circuit 1211, which outputs sector enable signal high voltage (SECEN_HV0 ... SECEN_HVN for N sectors) and sector enable signal high voltage bar (SECEN_HV0_N ... SECEN_HVN_N for N sectors).

Erase gate decoder 1220 comprises an erase gate decoder 1221 and other similar erase gate decoders (not shown) for rows 0, 1, ..., N in the sector. Here, erase gate decoder 1221 receives the sector enable signal high voltage (SECEN_HV0) from high voltage level shift circuit 1211, its complement (SECEN_HV0_N), a voltage erase gate supply (VEGSUP), a low voltage erase gate supply (VEGSUP_LOW), sector enable signal (SECEN), and its complement (SECEN_N). Thus, the output EG0 of erase gate decoder 1221 can be at one of two different voltage levels: VEGSUP (high or normal voltage), or VEGSUP_LOW (low voltage).

Similarly, source line decoder 1230 comprises source line decoder 1221 for and other similar source line decoders (not shown) for rows 0, 1, ..., N in the sector. Here, source line decoder 1231 receives sector enable signal high voltage (SECEN_HV0) from high voltage level shift circuit 1211, its complement (SECEN_HV0_N), a voltage source line supply (VSLSUP), a low voltage source line supply (VSLSUP_LOW), sector enable signal (SECEN), and its complement (SECEN_N). Thus, the output SL0 of source line decoder 1230 can be at one of two different voltage levels: VSLSUP (high or normal voltage), or VSLSUP_LOW (low voltage).

Similarly, control gate decoder 1240 comprises control gate decoder 1240 and other similar control gate decoders (not shown) for rows 0, 1, ..., N in the sector. Here, control gate decoder 1241 receives sector enable signal high voltage (SECEN_HV0) from high voltage level shift circuit 1211, its complement (SECEN_HV0_N), a voltage control gate supply (VCGSUP), a low voltage control gate supply (VCGSUP_LOW), sector enable signal (SECEN), and its complement (SECEN_N). Thus, the output CG0 of control gate decoder 1240 can be at one of two different voltage levels: VCGSUP (high or normal voltage), or VCGSUP_LOW (low voltage).

Figure 13:
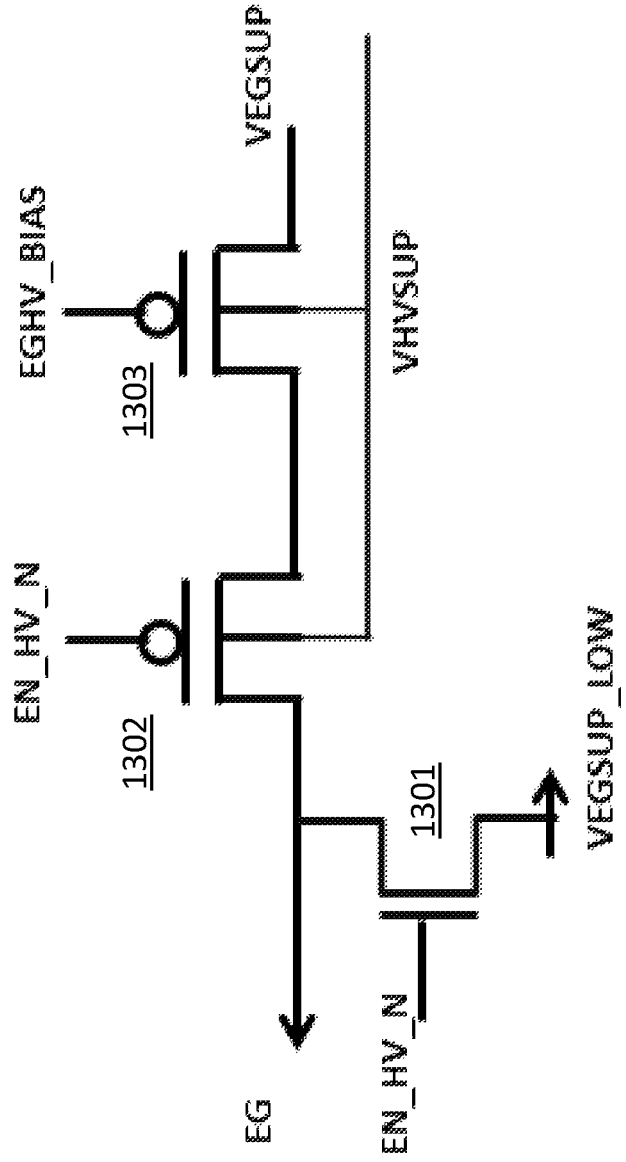
FIG. 13 depicts an embodiment of an erase gate decoder for use with the memory device of FIG. 2.

FIG. 13 shows erase gate decoder 1300, which is an embodiment of erase gate decoder 1220. Erase gate decoder 1300 comprises NMOS transistor 1301 and PMOS transistors 1302 and 1303, configured as shown. PMOS transistor 1303 is a current limiter with EGHV_BIAS as a current mirror bias level. When this erase gate signal (EG) is to be asserted, EN_HV_N will be low (e.g., 0V or 1.2V or 2.5V), which will turn on PMOS transistor 1302 and turn off NMOS transistor 1301, which will cause erase gate (EG) to be high (i.e. =VEGSUP, for example 11.5V). When this erase gate signal (EG) is to be not asserted, EN_HV_N will be high, which will turn off PMOS transistor 1302 and turn on NMOS transistor 1301, which will cause erase gate (EG) to be low (i.e., =VEGSUP_LOW level, for example 0V or 1.2V or 2.5V).

Figure 14:
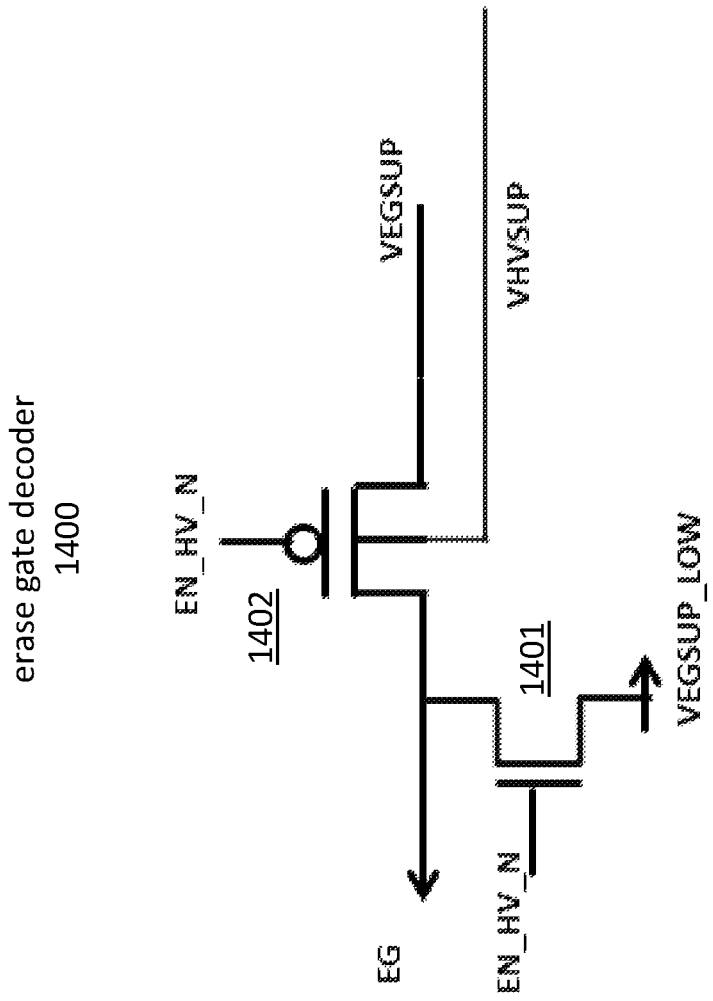
FIG. 14 depicts an embodiment of an erase gate decoder for use with the memory device of FIG. 2.

FIG. 14 shows erase gate decoder 1400, which another embodiment of erase gate decoder 1220. Erase gate decoder 1400 comprises NMOS transistor 1401 and PMOS transistor 1402. Erase gate decoder 1400 in this example does not contain a current limiter. When this erase gate signal (EG) is to be asserted, EN_HV_N will be low (e.g., 0V or 1.2V), which will turn on PMOS transistor 1402 and turn off NMOS transistor 1401, which will cause erase gate (EG) to be high. When this erase gate signal (EG) is to be not asserted, EN_HV_N will be high, which will turn off PMOS transistor 1402 and turn on NMOS transistor 1401, which will cause erase gate (EG) to be low (e.g., 0V or 1.2V or 2.5V).

Figure 15:
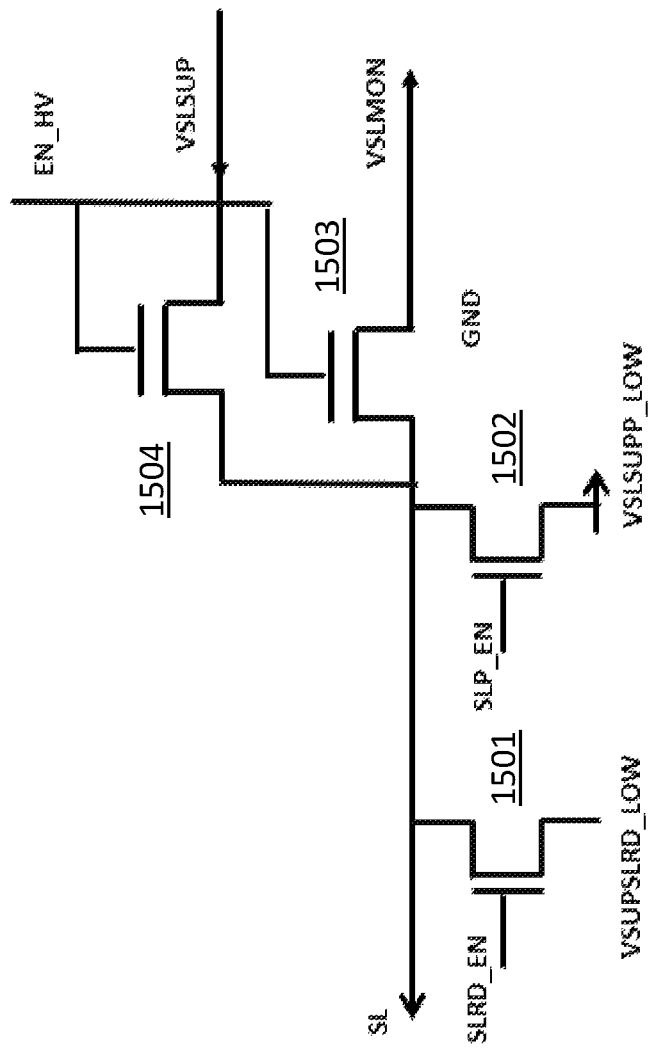
FIG. 15 depicts an embodiment of a source line decoder for use with the memory device of FIG. 2.

FIG. 15 shows source line decoder 1500, which is an embodiment of source line decoder 1230. Source line decoder 1500 comprises NMOS transistors 1501, 1502, 1503, and 1504, configured as shown. NMOS transistor 1501 pulls the source line (SL) low during a read operation in response to the SLRD_EN signal. NMOS transistor 1502 pulls the source line (SL) low during a programming operation in response to the SLP_EN signal. NMOS transistor 1503 performs a monitoring function, through output VSLMON. NMOS transistor 1504 provides a voltage to source line (SL) in response to the EN_HV signal.

Figure 16:
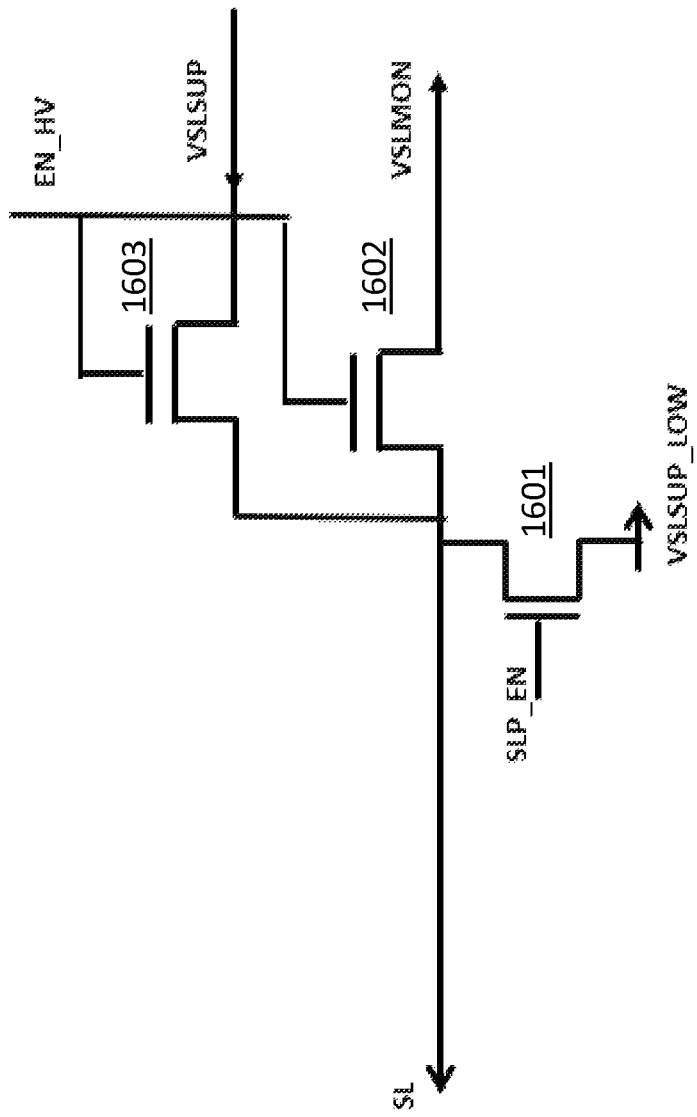
FIG. 16 depicts an embodiment of a source line decoder for use with the memory device of FIG. 2.

FIG. 16 shows source line decoder 1600, which is another embodiment of source line decoder 1230. Source line decoder 1600 comprises NMOS transistors 1601, 1602, and 1603, configured as shown. NMOS transistor 1601 pulls the source line (SL) low during a programming operation in response to the SLP_EN signal. NMOS transistor 1602 performs a monitoring function, through output VSLMON. NMOS transistor 1603 provides a voltage to source line (SL) in response to the EN_HV signal.

Figure 17:
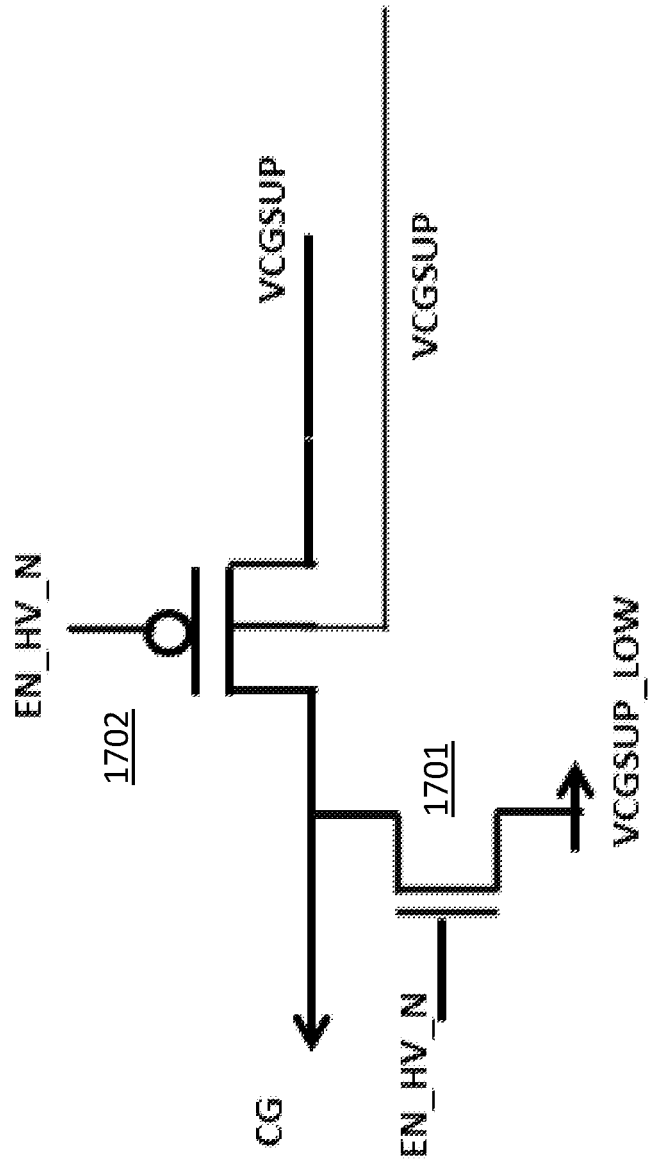
FIG. 17 depicts an embodiment of a control gate decoder for use with the memory device of FIG. 2.

FIG. 17 depicts control gate decoder 1700, which is the embodiment of control gate decoder 1240. Control gate decoder 1700 comprises NMOS transistor 1701 and PMOS transistor 1702. NMOS transistor 1701 will pull down the control gate signal (CG) in response to the signal EN_HV_N. PMOS transistor 1702 will pull up the control gate signal (CG) in response to the signal EN_HV_N.

Figure 18:
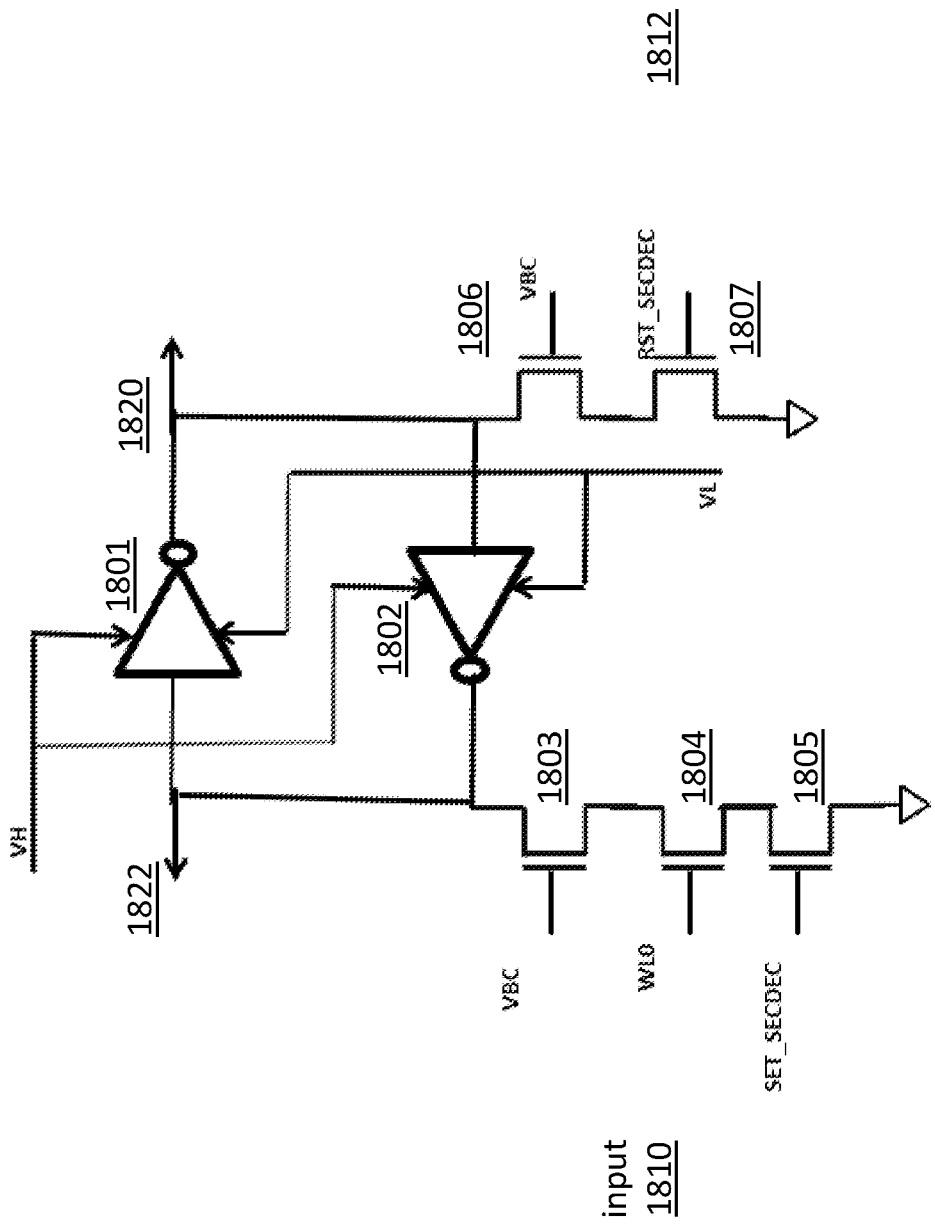
FIG. 18 depicts an embodiment of a latch voltage level shifter for use with the memory device of FIG. 2.

FIG. 18 depicts latch voltage level shifter 1800 with adaptive high voltage VH and low VL supplies. Latch voltage level shifter comprises a latch comprising inverters 1801 and 1802 and NMOS transistors 1803, 1804, 1805, 1806, and 1807, in the configuration shown. Latch voltage level shifter receives input 1812 to reset (input RST_SECDEC) and input 1810 to set, meaning enabling, (inputs WL0 and SET_SECDEC) and produces output 1820 and 1822. Latch voltage level shifter will adaptively change the magnitudes of a "high" voltage or a "low" voltage to minimize the voltage stress. The latch inverters 1801 and 1802 received power supply high VH and power supply low VL. Initially when enabling by the inputs 1810/1812, VH is Vdd, e.g. 1.2V, and VL is gnd. Then VH starts to ramp up to an intermediate VH level, e.g. 5V. At this VH level, VL then ramps to an intermediate VL level, e.g., 2.5V. After VL reached the intermediate VL level, VH then ramps to final high voltage supply VHVSUP level, e.g., 11.5V. At this point, the voltage across the inverters is only 11.5V−2.5V=9V, hence reducing the voltage stress across them.

Figure 19:
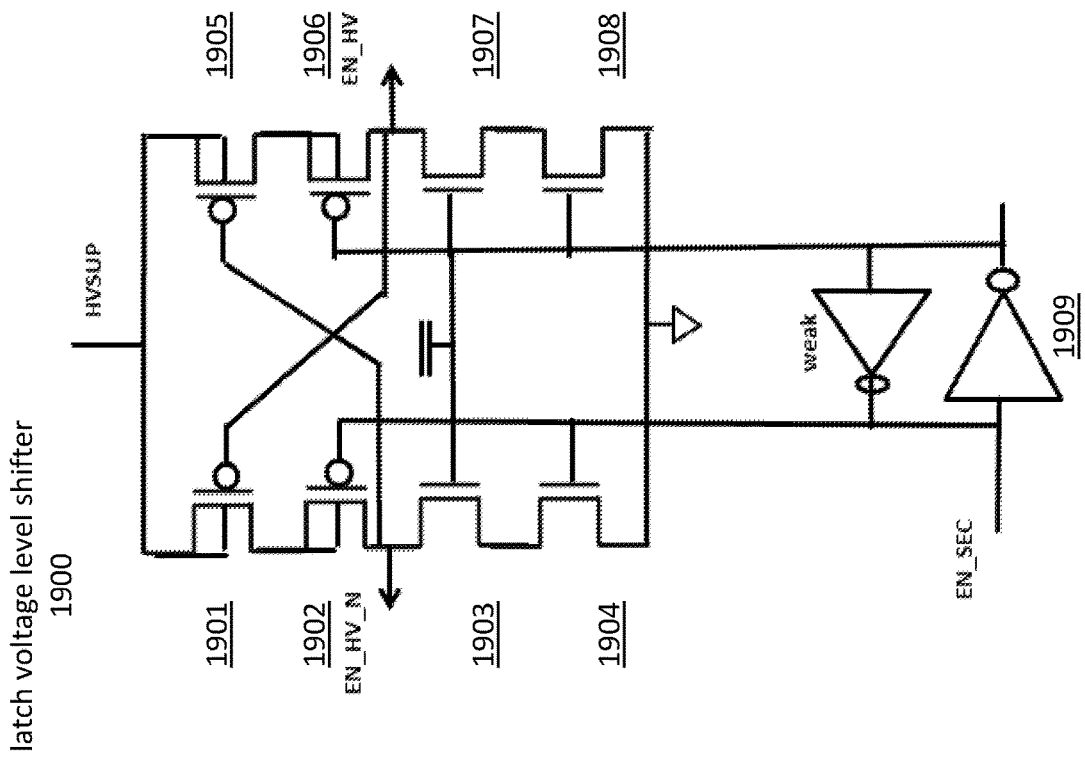
FIG. 19 depicts an embodiment of a latch voltage level shifter for use with the memory device of FIG. 2.

FIG. 19 depicts latch voltage shifter 1900. Latch voltage shifter 1900 comprises low voltage latch inverter 1909, NMOS transistors 1903, 1904, 1907, and 1908, and PMOS transistors 1901, 1902, 1905, and 1906, in the configuration shown. Latch voltage shifter 1800 receives EN_SEC as an input and outputs EN_HV and EN_HV_N, which have a larger voltage swing than EN_SEC and ground.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A non-volatile memory device comprising:
   an array of flash memory cells comprising a plurality of flash memory cells organized into rows and columns, wherein the array is further organized into a plurality of sectors, each sector comprising a plurality of rows of flash memory cells;
   a first column decoder selectively coupled to a first sector configured to operate in dual-column mode; and
   a second column decoder selectively coupled to a second sector configured to operate in single-column mode;
   wherein during a read or programming operation in the first sector, the first column decoder selects two immediately adjacent columns enabling reading or programming of two immediately adjacent flash memory cells and during a read or programming operation in the second sector, the second column decoder selects no more than one column enabling reading or programming of one flash memory cell.

2. The non-volatile memory device of claim 1, wherein the memory cells are split gate flash memory cells.

3. The non-volatile memory device of claim 1, wherein during a programming operation in the first sector, programming of the selected two columns occurs at different times.

4. The non-volatile memory device of claim 2, wherein during a programming operation in the first sector, programming of the selected two columns occurs at different times.

* * * * *